(12) United States Patent
Yoo et al.

(10) Patent No.: US 10,008,555 B2
(45) Date of Patent: Jun. 26, 2018

(54) DISPLAY DEVICE AND METHOD OF MANUFACTURING THE SAME

(71) Applicant: LG Display Co., Ltd., Seoul (KR)

(72) Inventors: DongHee Yoo, Seoul (KR); TaeHan Park, Seoul (KR); KyungHoon Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/458,898

(22) Filed: Mar. 14, 2017

(65) Prior Publication Data

US 2017/0294493 A1    Oct. 12, 2017

(30) Foreign Application Priority Data

Apr. 11, 2016  (KR) .......................... 10-2016-0044115

(51) Int. Cl.
| | |
|---|---|
| *H01L 27/00* | (2006.01) |
| *H01L 27/32* | (2006.01) |
| *H01L 51/52* | (2006.01) |
| *H01L 51/56* | (2006.01) |

(52) U.S. Cl.
CPC ...... *H01L 27/3246* (2013.01); *H01L 27/3218* (2013.01); *H01L 27/3258* (2013.01); *H01L 27/3262* (2013.01); *H01L 51/5209* (2013.01); *H01L 51/5253* (2013.01); *H01L 51/5275* (2013.01); *H01L 51/56* (2013.01); *H01L 2227/323* (2013.01)

(58) Field of Classification Search
CPC ......................... H01L 37/3246; H01L 27/3246
See application file for complete search history.

(56) References Cited

U.S. PATENT DOCUMENTS

| | | | |
|---|---|---|---|
| 2010/0176717 A1* | 7/2010 | Lee ..................... | H01L 51/5271 313/504 |
| 2013/0214301 A1* | 8/2013 | Yamada ................. | H01L 33/08 257/88 |
| 2014/0284570 A1 | 9/2014 | Jinta et al. | |
| 2014/0306201 A1 | 10/2014 | Yamazaki et al. | |
| 2016/0336385 A1 | 11/2016 | Li et al. | |

FOREIGN PATENT DOCUMENTS

CN           104952884          9/2015

OTHER PUBLICATIONS

Extended European Search Report for European Patent Application No. EP 17163564.2, Aug. 22, 2017, 8 Pages.

* cited by examiner

*Primary Examiner* — William Harriston
(74) *Attorney, Agent, or Firm* — Fenwick & West LLP

(57) ABSTRACT

Disclosed are an organic light emitting display device and a method of manufacturing the same, which reduce a loss of light emitted from an organic light emitting device, increase a lifetime of the organic light emitting device, and decrease consumption power of the organic light emitting display device. The organic light emitting display device includes a first electrode disposed on a first substrate, a bank disposed on the first electrode for dividing a plurality of emission parts, an organic light emitting layer disposed on the first electrode and the bank, a second electrode disposed on the organic light emitting layer, and an encapsulation layer disposed on the second electrode. The encapsulation layer fills a space between adjacent banks, and a refractive index of the bank is lower than a refractive index of the organic light emitting layer and a refractive index of the encapsulation layer.

20 Claims, 13 Drawing Sheets

DISPLAY DEVICE AND METHOD OF MANUFACTURING THE SAME

CROSS-REFERENCE TO RELATED APPLICATIONS

This application claims the benefit of the Korean Patent Application No. 10-2016-0044115 filed on Apr. 11, 2016, which is hereby incorporated by reference as if fully set forth herein.

BACKGROUND

Field of the Invention

The present invention relates to an organic light emitting display device and a method of manufacturing the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

As a type of display device, organic light emitting diode (OLED) display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include a display panel that displays an image. The display panel includes a plurality of organic light emitting devices and a bank that divides adjacent organic light emitting devices. The organic light emitting devices each includes a first electrode, a hole transporting layer, an organic light emitting layer, and an electron transporting layer, and a second electrode. In this case, when a high-level voltage is applied to the first electrode and a low-level voltage is applied to the second electrode, a hole and an electron respectively move to the organic light emitting layer through the hole transporting layer and the electron transporting layer and are recombine in the organic light emitting layer to emit light.

Organic light emitting display devices may be divided into a top emission type and a bottom emission type. The top emission type is a type where light emitted from an organic light emitting device is output in a direction toward an upper substrate of a display panel that does not include the TFTs for driving the OLEDs, and the bottom emission type is a type where the light emitted from the organic light emitting device is output in a direction toward a lower substrate of the display panel that includes the TFTs for driving the OLEDs.

In the top emission type, since the light emitted from the organic light emitting device is output in the direction toward the upper substrate of the display panel that does not include the TFTs for driving the OLEDs, an opening area is wide. Also, in the top emission type, since it is not required to design thin film transistors (TFTs) in consideration of the opening area, an area occupied by the TFTs is wide.

However, even in a top emission type OLED display, when the light emitted from the organic light emitting device travels in a direction toward a bank dividing the organic light emitting device, instead of the direction toward the upper substrate, the light can be lost without being irradiated in the direction toward the upper substrate. If a loss of the light emitted from the organic light emitting device is reduced, a lifetime of the organic light emitting device increases, and moreover, consumption power of the organic light emitting display device is reduced.

SUMMARY

Accordingly, the present invention is directed to provide an organic light emitting display device and a method of manufacturing the same that substantially obviate one or more problems due to limitations and disadvantages of the related art.

Embodiments herein are directed to providing an organic light emitting display device and a method of manufacturing the same, which reduce a loss of light emitted from an organic light emitting device, increase a lifetime of the organic light emitting device, and decrease consumption power of the organic light emitting display device.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages, as embodied and broadly described herein, there is provided an organic light emitting display device including a first electrode disposed on a first substrate, a bank disposed on the first electrode for dividing a plurality of emission parts, an organic light emitting layer disposed on the first electrode and the bank, a second electrode disposed on the organic light emitting layer, and an encapsulation layer disposed on the second electrode, wherein the encapsulation layer fills a space between adjacent banks, and a refractive index of the bank is lower than a refractive index of the organic light emitting layer and a refractive index of the encapsulation layer.

In another aspect of the present invention, there is provided a method of manufacturing an organic light emitting display device including forming a first electrode on a planarization layer disposed on a first substrate, forming a bank on the first electrode for dividing a plurality of emission parts, forming an organic light emitting layer on the first electrode and the bank, forming a second electrode on the organic light emitting layer, and forming an encapsulation layer on the second electrode to fill a space between adjacent banks, wherein a refractive index of the bank is lower than a refractive index of the organic light emitting layer and a refractive index of the encapsulation layer.

In another aspect of the present invention, there is provided a method of manufacturing an organic light emitting display device including forming a planarization layer, including an embossed pattern, on a first substrate, forming a first electrode on the planarization layer, forming a bank on the first electrode, for dividing a plurality of emission parts, forming an organic light emitting layer on the first electrode and the bank, forming a second electrode on the organic light emitting layer, and forming an encapsulation layer on the second electrode to fill a space between adjacent banks, wherein a refractive index of the bank is lower than a refractive index of the organic light emitting layer and a refractive index of the encapsulation layer.

In another aspect of the present invention, there is provided an organic light emitting display device comprising:

an first electrode on a first substrate; a bank on the first electrode, the bank dividing a plurality of emission parts included in a subpixel; an organic light emitting layer on the first electrode and the bank; a second electrode on the organic light emitting layer; and an encapsulation layer on the second electrode, wherein the encapsulation layer fills a space between adjacent banks, and a refractive index of the bank is lower than a refractive index of the organic light emitting layer and a refractive index of the encapsulation layer.

In still another embodiment, an organic light emitting diode (OLED) display device including a plurality of pixels is provided, wherein at least one of the pixels comprises: a first substrate, a driving transistor of said at least one of the pixels on the first substrate, one or more banks on the first substrate, an organic light emitting diode (OLED) including a first electrode, an organic light emission layer on the first electrode, and a second electrode on the organic light emission layer. The organic light emission layer is shaped as one or more emission parts between the banks, wherein at least one of the emission parts includes a plurality of convex regions protruding away from the first substrate and a plurality of concave regions protruding toward the first substrate. The convex regions alternate with the concave regions and each of the convex regions is disposed on a corresponding convex pattern of a material having a first refractive index lower than a second refractive index of the organic light emission layer; and an encapsulation layer on the OLED.

In some embodiments, the first refractive index of the material of the convex pattern may be lower than a third refractive index of the encapsulation layer. In other embodiments, a first difference between the second refractive index of the organic light emitting layer and a third refractive index of the encapsulation layer may be less than a second difference between a fourth refractive index of the banks and the second refractive index of the organic light emitting layer. In still other embodiments, a first difference between the second refractive index of the organic light emitting layer and a third refractive index of the encapsulation layer may be less than a second difference between a fourth refractive index of the banks and the third refractive index of the encapsulation layer.

In some embodiments, the convex pattern is part of the banks. In other embodiments, the convex pattern is part of a planarization layer covering the driving transistor and the first substrate.

In some embodiments, the first electrode is disposed below the convex pattern. In other embodiments, the first electrode is disposed on the convex pattern. In still other embodiments, a first height of the convex pattern is lower than a second height of the banks.

In some embodiments, the encapsulation layer comprises a first inorganic layer on the second electrode, an organic layer on the first inorganic layer, the organic layer filling space between adjacent ones of the bank, and a second inorganic layer on the organic layer. In other embodiments, the encapsulation layer comprises a first inorganic layer on the second electrode, the first inorganic layer filling space between adjacent ones of the banks, an organic layer on the first inorganic layer, and a second inorganic layer on the organic layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
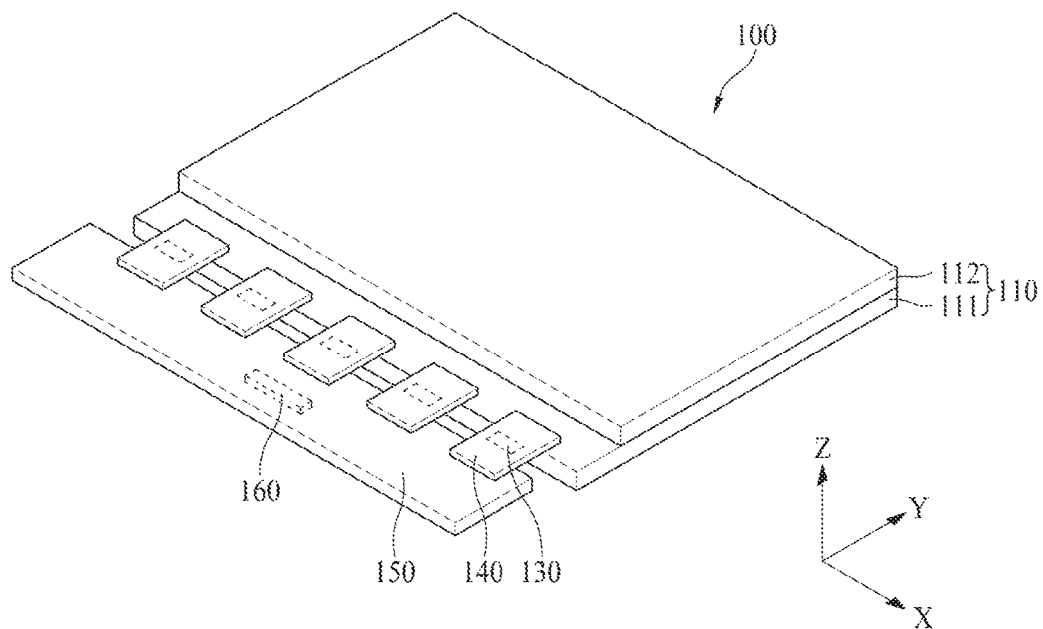
FIG. 1 is a perspective view illustrating an organic light emitting display device according to an embodiment.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

An X axis direction, a Y axis direction, and a Z axis direction should not be construed as only a geometric relationship where a relationship therebetween is vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings. The following description will focus on an example where an organic light emitting display device is implemented as a top emission type. The top emission type denotes a type where light emitted from an organic light emitting device is output in a direction toward an upper substrate 112.

Figure 2:
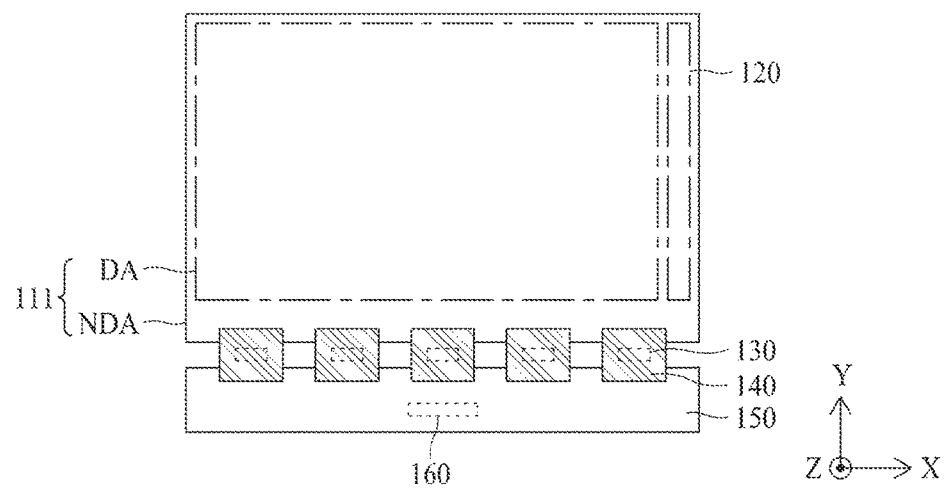
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light emitting display device 100 according to an embodiment of the present invention. FIG. 2 is a plan view illustrating a first substrate, a gate driver, a source drive integrated circuit (IC), a flexible film, a circuit board, and a timing controller of FIG. 1.

Referring to FIGS. 1 and 2, the organic light emitting display device 100 according to an embodiment of the present invention may include a display panel 110, a gate driver 120, a source drive IC 130, a flexible film 140, a circuit board 150, and a timing controller 160.

The display panel 110 may include a first substrate 111 and a second substrate 112. The second substrate 112 may be an encapsulation substrate. The first substrate 111 and the second substrate 112 may be plastic or glass.

A plurality of gate lines, a plurality of data lines, and a plurality of pixels may be provided on one surface of the first substrate 111 facing the second substrate 112. The pixels may each include a plurality of subpixels and may be respectively provided in a plurality of areas defined by intersections of the gate lines and the data lines.

Each of the plurality of subpixels may include at least one thin film transistor (TFT) and an organic light emitting device. When the at least one TFT is turned on by a gate signal of a gate line, each of the plurality of subpixels may be supplied with a data voltage through a data line. Each of the plurality of subpixels may control a current flowing to the organic light emitting device according to a data voltage, thereby allowing the organic light emitting device to emit light having certain brightness. The plurality of subpixels will be described below in detail with reference to FIGS. 3 to 8.

The display panel 110, as illustrated in FIG. 2, may be divided into a display area DA which displays an image and a non-display area NDA which does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or each of both sides of the display area DA of the display panel 110 in a gate driver in panel (GIP) type. Alternatively, the gate driver 120 may be manufactured as a driving chip, mounted on a flexible film, and attached on the non-display area NDA outside the one side or each of the both sides of the display area DA of the display panel 110 in a tape automated bonding (TAB) type.

The source drive IC 130 may receive digital video data and a source control signal from the timing controller 160. The source drive IC 130 may convert the digital video data into analog data voltages according to the source control signal and may respectively supply the analog data voltages to the data lines. In a case where the source drive IC 130 is manufactured as a driving chip, the source drive IC 130 may be mounted on the flexible film 140 in a chip-on film (COF) type or a chip-on plastic (COP) type.

A plurality of pads such as data pads may be provided in the non-display area NDA of the display panel 110. A plurality of lines connecting the pads to the source drive IC 130 and a plurality of lines connecting the pads to lines of the circuit board 150 may be provided in the flexible film 140. The flexible film 140 may be attached on the pads by using an anisotropic conducting film, and thus, the pads may be connected to the lines of the flexible film 140.

A plurality of flexible films 140 may be provided, and the circuit board 150 may be attached on the plurality of flexible films 140. A plurality of circuits which are respectively implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate the gate control signal for controlling an operation timing of the gate driver 120 and a source control signal for controlling a plurality of the source drive ICs 130, based on the timing signal. The timing controller 160 may supply the gate control signal to the gate driver 120 and may supply the source control signal to the source drive ICs 130.

Figure 3:
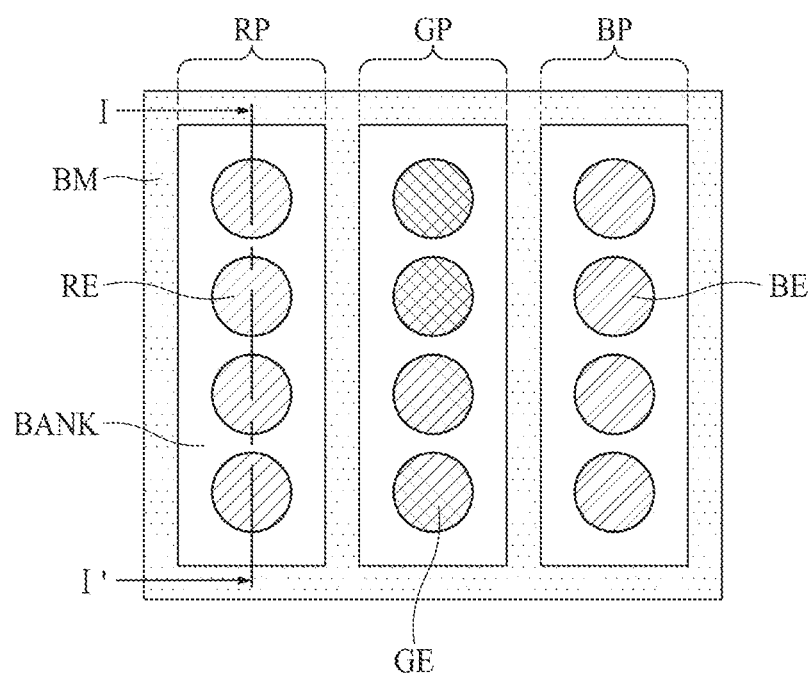
FIG. 3 is a plan view illustrating some of pixels provided in a display area of FIG. 2.

FIG. 3 is a plan view illustrating some of pixels provided in the display area DA of FIG. 2.

Referring to FIG. 3, each of a plurality of pixels P provided in the display area DA may include a red subpixel RP, a green subpixel GP, and a blue subpixel BP as illustrated in FIG. 3. The red subpixel RP may denote a subpixel that emits red light, the green subpixel GP may denote a subpixel that emits green light, and the blue subpixel BP may denote a subpixel that emits blue light. An embodiment of the present invention is not limited to each of the pixels P including the red subpixel RP, the green subpixel GP, and the blue subpixel BP, and the number of subpixels of each pixel P and a combination of colors of the subpixels may be changed based on a characteristic of the display panel 110.

The subpixels RP, GP, and BP may respectively include a plurality of emission parts RE, GE, and BE. The red subpixel RP may include a plurality of red emission parts RE that emit red light, the green subpixel GP may include a plurality of green emission parts GE that emit green light, and the blue subpixel BP may include a plurality of blue emission parts BE that emit blue light. The plurality of emission parts RE, GE, and BE may be divided by a bank BANK.

An organic light emitting device of each of the plurality of emission parts RE, GE, and BE may emit white light. In this case, each of the plurality of subpixels RP, GP, and BP may include a color filter to generate the red, green, blue color light, respectively. Also, as illustrated in FIG. 3, a black matrix BM for preventing mixing of colors may be provided between the color filters of the subpixels RP, GP, and BP. That is, the subpixels RP, GP, and BP may be divided by the black matrix BM.

The organic light emitting device of each of the plurality of emission parts RE, GE, and BE may emit light having a certain color instead of white light. For example, the organic light emitting device of the red emission part RE may emit red light, the organic light emitting device of the green emission part GE may emit green light, and the organic light emitting device of the blue emission part BE may emit blue light. In this case, each of the plurality of subpixels RP, GP, and BP may not include a color filter.

In FIG. 3, the plurality of emission parts RE, GE, and BE are illustrated as having a circular shape instead of a planar shape, but are not limited thereto. That is, a planar shape of each of the plurality of emission parts RE, GE, and BE may be a polygonal shape such as a triangular shape, a tetragonal shape, a pentagonal shape, etc.

As described above, in an embodiment of the present invention, the subpixels RP, GP, and BP may respectively include the plurality of emission parts RE, GE, and BE, and the plurality of emission parts RE, GE, and BE may be divided by the bank BANK. Here, in a case where a refractive index of the bank BANK is lower than that of each of a plurality of layers provided in the plurality of emission parts RE, GE, and BE, when light emitted from the organic light emitting device is incident on the bank BANK at an angle which is greater than a predetermined threshold angle, the light may be totally reflected by the bank BANK. That is, in an embodiment of the present invention, light which travels from the organic light emitting device to the bank BANK may be totally reflected by the bank BANK and may be output in a direction toward an upper substrate, thereby reducing a loss of the light emitted from the organic light emitting device.

Hereinafter, a cross-sectional structure of each of the subpixels RP, GP, and BP will be described with reference to FIGS. 4 and 5.

Figure 4:
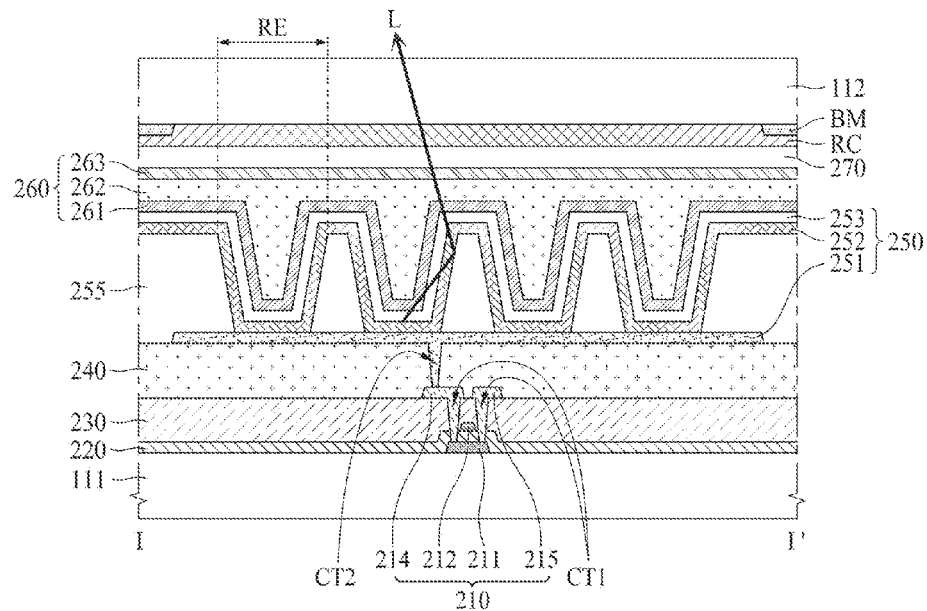
FIG. 4 is a cross-sectional view illustrating an example taken along line I-I' of FIG. 3.

FIG. 4 is a cross-sectional view illustrating an example taken along line I-I' of FIG. 3.

Referring to FIG. 4, a plurality of TFTs 210 may be formed on one surface of the first substrate 111 facing the second substrate 112. Each of the TFTs 210 may include an active layer 211, a gate electrode 212, a source electrode 215, and a drain electrode 214. In FIG. 4, the TFTs 210 are exemplarily illustrated as being formed in a top gate type where the gate electrode 212 is disposed on the active layer 211, but is not limited thereto. That is, the TFTs 210 may be formed in a bottom gate type where the gate electrode 212 is disposed under the active layer 211 or a double gate type where the gate electrode 212 is disposed both on and under the active layer 211.

The active layer 211 may be formed on the first substrate 111. The active layer 211 may be formed of a silicon-based semiconductor material or an oxide-based semiconductor material.

A buffer layer (not shown) for protecting the active layer 211 and increasing an interface adhesive force of the active layer 211 may be formed between the first substrate 111 and the active layer 211. The buffer layer (not shown) may be formed of silicon oxide (SiOx), silicon nitride (SiNx), SiON, or a multilayer thereof.

Moreover, a light blocking layer (not shown) for blocking external light incident on a plurality of the active layers 211 may be formed between the first substrate 111 and each of the active layers 211. The light blocking layer (not shown) may be formed of an opaque metal material.

A gate insulation layer 220 may be formed on each of the active layers 211. The gate insulation layer 220 may be formed of an inorganic layer, and for example, may be formed of silicon oxide (SiOx), silicon nitride (SiNx), or a multilayer thereof.

A plurality of the gate electrodes 212 and a plurality of gate lines may be formed on the gate insulation layer 220. The gate electrodes 212 and the gate lines may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be formed on the gate electrodes 212. For example, the interlayer insulation layer 230 may be formed of an inorganic layer, and for example, may be formed of SiOx, SiNx, or a multilayer thereof.

A plurality of the source electrodes 215, a plurality of the drain electrodes 214, and a plurality of data lines (not shown in FIG. 4) may be formed on the interlayer insulation layer 230. Each of the source electrodes 215 and the drain electrodes 214 may contact the active layer 211 through a contact hole CT1 which passes through the gate insulation layer 220 and the interlayer insulation layer 230. The source electrodes 213, the drain electrodes 214, and the data lines may each be formed of a single layer or a multilayer which includes one of Mo, Al, Cr, Au, Ti, Ni, Nd, and Cu, or an alloy thereof.

A planarization layer 240 for planarizing a top of each of the TFTs 210 may be formed on the source electrodes 215, the drain electrodes 214, and the data lines. The planarization layer 240 may be formed of an organic layer such as acryl resin, epoxy resin, phenolic resin, polyamide resin, polyimide resin, and/or the like.

A plurality of emission parts RE including a plurality of organic light emitting devices 250 may be formed on the planarization layer 240. The organic light emitting devices 250 may each include a first electrode 251, an organic light emitting layer 252, and a second electrode 253. The emission parts RE may be divided by a bank 255. The first electrode may be an anode electrode, and the second electrode may be a cathode electrode.

The first electrode 251 may be formed on the planarization layer 240. The first electrode 251 may be connected to a drain electrode 214 through a contact hole CT2 which passes through the planarization layer 240. In order to obtain a micro-cavity effect, the first electrode 251 may be a metal material, which is high in reflectivity, such as a stacked structure (Ti/Al/Ti) of aluminum (Al) and titanium (Ti), a stacked structure (ITO/Al/ITO) of Al and ITO (indium tin oxide), an APC alloy, or a stacked structure (ITO/APC/ITO) of an APC alloy and ITO. The APC alloy may be an alloy of silver (Ag), palladium (Pd), and copper (Cu).

The bank 255 may be formed on the first electrode 251 for dividing the emission parts RE. The bank 255 may be formed of an organic material having a refractive index lower than that of the organic light emitting layer 252, for totally reflecting light L emitted from the organic light emitting layer 252. For example, the bank 255 may be formed of an organic material having a refractive index of 1.6 or less, and for example, may be formed of a photo acryl-based material. Also, a height of the bank 255 may be adjusted to 3 µm or more, for increasing a ratio where the light L emitted from the organic light emitting layer 252 is totally reflected by the bank 255.

The organic light emitting layer 252 may be formed on the first electrode 251 and the bank 255. The organic light emitting layer 252 may include a hole transporting layer, a light emitting layer, and an electron transporting layer. In this case, when a voltage is applied to the first electrode 251 and the second electrode 253, a hole and an electron move to the light emitting layer through the hole transporting layer and the electron transporting layer and recombine in the light emitting layer to emit light.

The organic light emitting layer 252 may include only a white light emitting layer that emits white light. If the organic light emitting layer 252 is the white light emitting layer, as illustrated in FIG. 4, the organic light emitting layer 252 may be formed to cover a plurality of the first electrodes 251 and the bank 255.

Alternatively, the organic light emitting layer 252 may include a red light emitting layer that emits red light, a green light emitting layer that emits green light, and a blue light emitting layer that emits blue light, all separated from each other. In this case, the red light emitting layer may be formed on the first electrode 251 of a red emission part RE, the green light emitting layer may be formed on the first electrode 251 of a green emission part GE, and the blue light emitting layer may be formed on the first electrode 251 of a blue emission part BE.

The organic light emitting layer 252 may be formed of an organic material having a refractive index of about 1.8 or more.

The second electrode 253 may be formed on the organic light emitting layer 252. The second electrode 253 may be formed of a transparent conductive material (or TCO), such as indium tin oxide (ITO) or indium zinc oxide (IZO) capable of transmitting light, or may be formed of a semi-transmissive conductive material such as magnesium (Mg), silver (Ag), or an alloy of Mg and Ag.

A capping layer (not shown) may be formed on the second electrode 253. The capping layer (not shown) may be formed of an organic material having a refractive index of about 1.8 or more, and for example, may be formed of an organic material having a refractive index matching that of the organic light emitting layer 252. The capping layer (not shown) may be omitted.

An encapsulation layer 260 may be formed on the second electrode 253. The encapsulation layer 260 prevents oxygen or water from penetrating into the organic light emitting layer 252 and the second electrode 253. To this end, the encapsulation layer 260 may include at least one inorganic layer and at least one organic layer. In FIG. 3, the encapsulation layer 260 is illustrated as including a first inorganic layer 261, an organic layer 262, and a second inorganic layer 263, but is not limited thereto.

The first inorganic layer 261 may be formed on the second electrode 253 to cover the second electrode 253. The organic layer 262 may be formed on the first inorganic layer 261, for preventing particles from penetrating into the organic light emitting layer 252 and the second electrode 253 via the first inorganic layer 261. The second inorganic layer 263 may be formed on the organic layer 262 to cover the organic layer 262.

Each of the first and second inorganic layers 261 and 263 may be formed of silicon nitride, aluminum nitride, zirconium nitride, titanium nitride, hafnium nitride, tantalum nitride, silicon oxide, aluminum oxide, titanium oxide, and/or the like. The first inorganic layer 261 may be formed of an organic material having a refractive index of about 1.8 or more, and for example, may be formed of an organic material having a refractive index matching that of the organic light emitting layer 252.

The organic layer 262 may be transparently formed for transmitting the light L emitted from the organic light emitting layer 253. The organic layer 262 may be formed of an organic material capable of transmitting 99% or more of the light L emitted from the organic light emitting layer 253.

Moreover, the organic layer 262 may be formed to fill a space between adjacent banks 255 so as to planarize a step height, caused by a height of the bank 255, between the bank 255 and the emission part RE. The organic layer 262 may be formed of an organic material having a refractive index of about 1.8 or more, and for example, may be formed of an organic material having a refractive index matching that of the organic light emitting layer 252. To this end, the organic layer 262 may include a vinyl compound, a photopolymerization initiator, toluene, and 2,6-di-tert-butyl-4-methylphenol. In this case, the vinyl compound may be phenyl sulfide.

A plurality of color filters RC and the black matrix BM may be formed on the second substrate 112 facing the first substrate 111. A red color filter RC may be formed in the red subpixel RP, a green color filter may be formed in the green subpixel GP, and a blue color filter may be formed in the blue subpixel BP. The black matrix BM may be disposed between color filters having different colors. Therefore, the black matrix BM may divide the subpixels RP, GP, and BP.

If the organic light emitting layer 252 includes the red light emitting layer that emits red light, the green light emitting layer that emits green light, and the blue light emitting layer that emits blue light, the color filters RC and the black matrix BM may be omitted.

The encapsulation layer 260 of the first substrate 111 and the color filters RC of the second substrate 112 may be adhered to each other by using an adhesive layer 270, and thus, the first substrate 111 and the second substrate 112 may be bonded to each other. The adhesive layer 270 may be a transparent adhesive resin.

As described above, in an embodiment of the present invention, the organic light emitting layer 252 and the first inorganic layer 261 and the organic layer 262 of the encapsulation layer 260 may be formed to have a refractive index of 1.8 or more, and the bank 255 may be formed to have a refractive index of 1.6 or less. Particularly, as a difference between a refractive index of the bank 255 and a refractive index of each of the organic light emitting layer 252, the first inorganic layer 261, and the organic layer 262 increases, a total reflection rate where the light L emitted from the organic light emitting layer 252 is totally reflected by the bank 255 becomes higher. Also, in order to increase a total reflection rate, the organic light emitting layer 252, the first inorganic layer 261, and the organic layer 262 may have the same refractive index.

As a result, in an embodiment of the present invention, a difference between a refractive index of the organic light emitting layer 252 and a refractive index of the first inorganic layer 261 may be less than a difference between a refractive index of the organic light emitting layer 252 and a refractive index of the bank 255 and a difference between a refractive index of the first inorganic layer 261 and a refractive index of the bank 255. Also, a difference between a refractive index of the organic light emitting layer 252 and a refractive index of the organic layer 262 may be less than a difference between a refractive index of the organic light emitting layer 252 and a refractive index of the bank 255 and a difference between a refractive index of the organic layer 262 and a refractive index of the bank 255. In this case, light which travels from the organic light emitting layer 252 to the bank 255 may travel from a medium having a high refractive index to a medium having a low refractive index, and thus, when the light is incident on the bank 255 at an angle which is equal to or greater than a predetermined threshold angle, the light may be totally reflected from a boundary of the bank 255. Accordingly, in an embodiment of the present invention, the light which travels from the organic light emitting layer 252 to the bank 255 may be totally reflected by the bank 255 and may be output in a direction toward an upper substrate, thereby reducing a loss of the light L emitted from the organic light emitting layer 252.

Moreover, in an embodiment of the present invention, a height of the bank 255 may be adjusted to 3 μm or more for increasing a total reflection effect by the bank 255, and in this case, a step height can occur between the bank 255 and the emission part RE due to the height of the bank 255. In an embodiment of the present invention, the encapsulation layer 260 may fill the space between the adjacent banks 255, and thus, the step height between the bank 255 and the emission part RE may be planarized. Particularly, according to an embodiment of the present invention, an organic material filling the space between the adjacent banks 255 may have a refractive index matching a refractive index of the organic light emitting layer 252, and thus, the light which travels from the organic light emitting layer 252 to the bank 255 may be totally reflected by the bank 255 and may be output in the direction toward the upper substrate (i.e., the second substrate 112).

Figure 5:
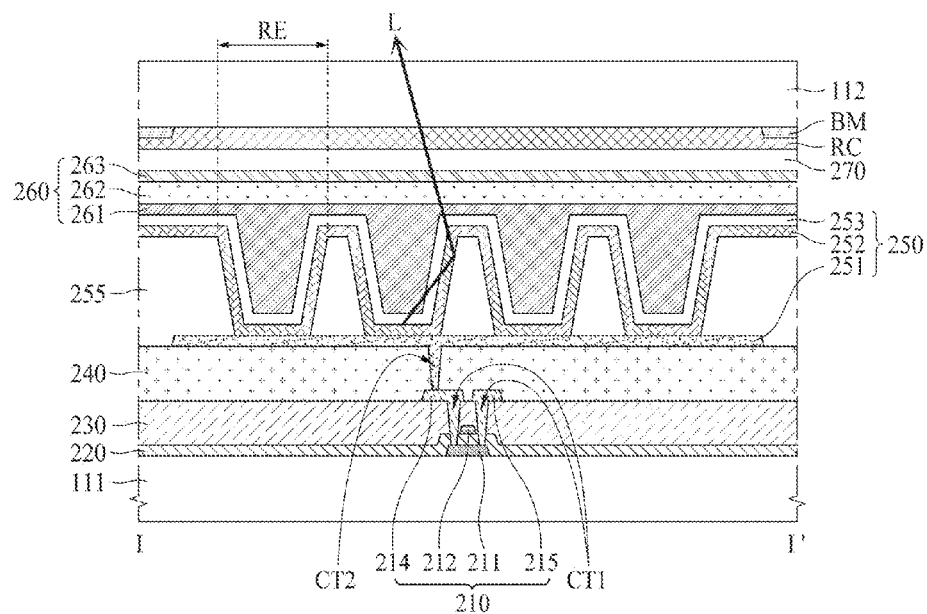
FIG. 5 is a cross-sectional view illustrating an example taken along line I-I' of FIG. 3.

FIG. 5 is a cross-sectional view illustrating an example taken along line I-I' of FIG. 3.

Except that a first inorganic layer 261 instead of an organic layer 262 fills a space between adjacent banks 255 for planarizing a step height between the bank 255 and an emission part RE, the cross-sectional view of FIG. 5 is as substantially described above with reference to FIG. 4. Therefore, a detailed description on the cross-sectional view of FIG. 5 is omitted.

Figure 6:
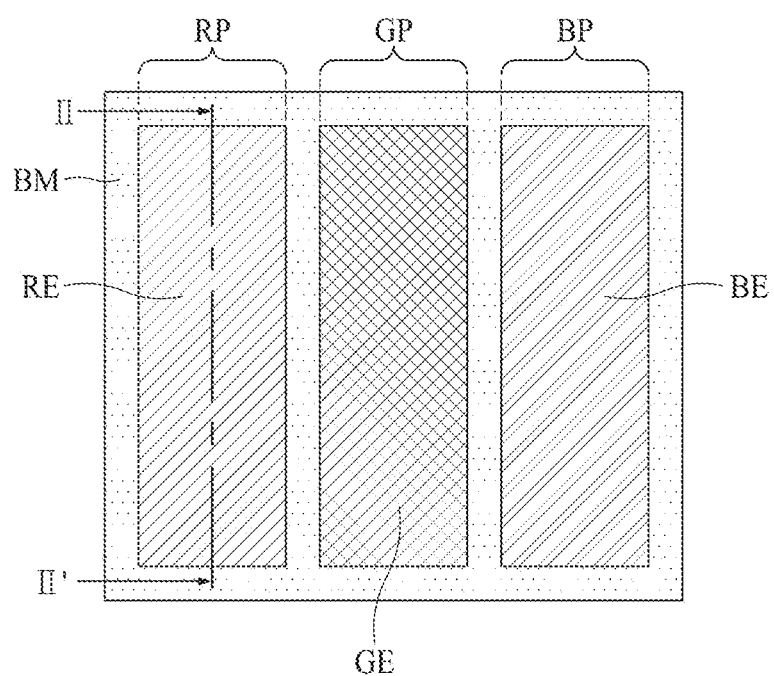
FIG. 6 is another plan view illustrating some of the pixels provided in the display area of FIG. 2.

FIG. 6 is another plan view illustrating some of the pixels provided in the display area DA of FIG. 2.

Referring to FIG. 6, each of a plurality of pixels P provided in the display area DA may include a red subpixel RP, a green subpixel GP, and a blue subpixel BP as illustrated in FIG. 3. The red subpixel RP may denote a subpixel that emits red light, the green subpixel GP may denote a subpixel that emits green light, and the blue subpixel BP may denote a subpixel that emits blue light. An embodiment of the present invention is not limited to each of the pixels P including the red subpixel RP, the green subpixel GP, and the blue subpixel BP, and the number of subpixels of each pixel P and a combination of colors of the subpixels may be changed based on a characteristic of the display panel 110.

The subpixels RP, GP, and BP may respectively include one emission part. The red subpixel RP may include one red emission part RE that emits red light, the green subpixel GP may include one green emission part GE that emits green light, and the blue subpixel BP may include one blue emission part BE that emits blue light. The emission parts may be divided by a bank (not shown).

An organic light emitting device of each of the emission parts may emit white light. In this case, each of the plurality of subpixels RP, GP, and BP may include a corresponding color filter. Also, as illustrated in FIG. 6, a black matrix BM for preventing mixing of colors may be provided between the color filters of the subpixels RP, GP, and BP. The black matrix BM may be formed on the bank (not shown).

The organic light emitting device of each of the plurality of emission parts may emit light having a certain color instead of white light. For example, the organic light emitting device of the red emission part RE may emit red light, the organic light emitting device of the green emission part GE may emit green light, and the organic light emitting device of the blue emission part BE may emit blue light. In this case, each of the plurality of subpixels RP, GP, and BP may not include a color filter.

As described above, in an embodiment of the present invention, each of the subpixels RP, GP, and BP may include one emission part, and the emission parts may be divided by the bank (not shown). Here, in a case where a refractive index of the bank (not shown) is lower than that of each of a plurality of layers provided in the one emission part, when light emitted from the organic light emitting device is incident on the bank (not shown) at an angle which is greater than a predetermined threshold angle, the light may be totally reflected by the bank (not shown). That is, in an embodiment of the present invention, light which travels from the organic light emitting device to the bank (not shown) may be totally reflected by the bank (not shown) and may be output in a direction toward an upper substrate, thereby reducing a loss of the light emitted from the organic light emitting device.

Hereinafter, a cross-sectional structure of each of the subpixels RP, GP, and BP will be described with reference to FIGS. 7 and 8.

Figure 7:
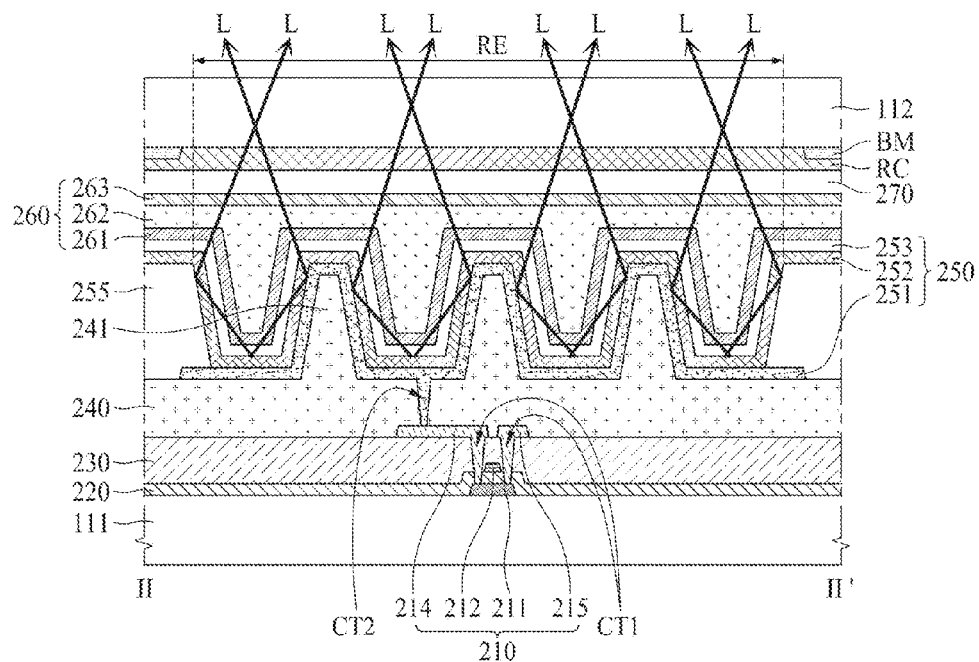
FIG. 7 is a cross-sectional view illustrating another example taken along line II-II' of FIG. 6.

FIG. 7 is a cross-sectional view illustrating another example taken along line II-II' of FIG. 6.

A first substrate 111, a TFT 210, a gate insulation layer 220, and an interlayer insulation layer 230 illustrated in FIG. 7 is as substantially described above with reference to FIG. 4, and thus, their detailed descriptions are omitted.

Referring to FIG. 7, a planarization layer 240 for planarizing a top of each of a plurality of the TFTs 210 may be formed on a plurality of source electrodes 215, a plurality of drain electrodes 214, and a plurality of data lines. The planarization layer 240 may be formed of an organic layer such as acryl resin, epoxy resin, phenolic resin, polyamide resin, polyimide resin, and/or the like.

The planarization layer 240 may include an embossed pattern 241 that protrudes from the planarization layer 240. The embossed pattern 241 may be disposed between adjacent banks 255. Also, a height of the embossed pattern 241 may be equal to or lower than that of the bank 255. If the height of the embossed pattern 241 is higher than that of the bank 255, an encapsulation layer 260 for planarizing a step height caused by the embossed pattern 241 may fill a space between adjacent embossed patterns 241, and thus, a thickness of the encapsulation layer 260 may be thickened. Accordingly, the height of the embossed pattern 241 may be equal to or lower than that of the bank 255.

A plurality of emission parts RE including a plurality of organic light emitting devices 250 may be formed on the planarization layer 240. The organic light emitting devices 250 may each include a first electrode 251, an organic light emitting layer 252, and a second electrode 253. The emission parts RE may be divided by a bank 255.

The first electrode 251 may be formed on the planarization layer 240. The first electrode 251 may be connected to the drain electrode 214 through a contact hole CT2 which passes through the planarization layer 240. In order to obtain a micro-cavity effect, the first electrode 251 may be a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The first electrode 251 may also be formed on the embossed pattern 241 of the planarization layer 240. Therefore, the first electrode 251 may totally reflect light traveling from the organic light emitting layer 252 to the embossed pattern 241, and the light may be output in a direction toward an upper substrate. Accordingly, according to an embodiment of the present invention, a loss of light L emitted from the organic light emitting layer 252 is reduced.

The bank 255 may be formed to cover an edge of the first electrode 251, for dividing the emission parts RE. The bank 255 may be formed of an organic material having a refractive index lower than that of the organic light emitting layer 252, for totally reflecting light L emitted from the organic light emitting layer 252. For example, the bank 255 may be formed of an organic material having a refractive index of 1.6 or less, and for example, may be formed of a photo acryl-based material. Also, a height of the bank 255 may be adjusted to 3 μm or more, for increasing a ratio where the light L emitted from the organic light emitting layer 252 is totally reflected by the bank 255.

The planarization layer 240 may be disposed under the first electrode 251, and the bank 255 may be disposed on the first electrode 251. Accordingly, the planarization layer 240 and the bank 255 may be formed through separate processes, and for this reason, may be formed of different materials.

The organic light emitting layer 252 may be formed on the first electrode 251 and the bank 255. The organic light emitting layer 252 may include a hole transporting layer, a light emitting layer, and an electron transporting layer. In this case, when a voltage is applied to the first electrode 251 and the second electrode 253, a hole and an electron move to the light emitting layer through the hole transporting layer and the electron transporting layer and recombine in the light emitting layer to emit light.

The organic light emitting layer 252 may include only a white light emitting layer that emits white light. If the organic light emitting layer 252 is the white light emitting layer, as illustrated in FIG. 7, the organic light emitting layer 252 may be formed to cover a plurality of the first electrodes 251 and the bank 255.

Alternatively, the organic light emitting layer 252 may include a red light emitting layer that emits red light, a green light emitting layer that emits green light, and a blue light emitting layer that emits blue light. In this case, the red light emitting layer may be formed on the first electrode 251 of a red emission part RE, the green light emitting layer may be formed on the first electrode 251 of a green emission part GE, and the blue light emitting layer may be formed on the first electrode 251 of a blue emission part BE.

The organic light emitting layer 252 may be formed of an organic material having a refractive index of about 1.8 or more.

The second electrode 253 may be formed on the organic light emitting layer 252. The second electrode 253 may be formed of a transparent conductive material (or TCO), such as indium tin oxide (ITO) or indium zinc oxide (IZO) capable of transmitting light, or may be formed of a semi-transmissive conductive material such as Mg, Ag, or an alloy of Mg and Ag.

A capping layer (not shown) may be formed on the second electrode 253. The capping layer (not shown) may be formed of an organic material having a refractive index of about 1.8 or more, and for example, may be formed of an organic material having a refractive index matching that of the organic light emitting layer 252. The capping layer (not shown) may be omitted.

An encapsulation layer 260 may be formed on the second electrode 253. The encapsulation layer 260 prevents oxygen or water from penetrating into the organic light emitting layer 252 and the second electrode 253. To this end, the encapsulation layer 260 may include at least one inorganic layer and at least one organic layer. In FIG. 7, the encapsulation layer 260 is illustrated as including a first inorganic layer 261, an organic layer 262, and a second inorganic layer 263, but is not limited thereto.

The first inorganic layer 261 may be formed on the second electrode 253 to cover the second electrode 253. The organic layer 262 may be formed on the first inorganic layer 261, for preventing particles from penetrating into the organic light emitting layer 252 and the second electrode 253 via the first inorganic layer 261. The second inorganic layer 263 may be formed on the organic layer 262 to cover the organic layer 262.

Each of the first and second inorganic layers 261 and 263 may be formed of silicon nitride, aluminum nitride, zirconium nitride, titanium nitride, hafnium nitride, tantalum nitride, silicon oxide, aluminum oxide, titanium oxide, and/or the like. The first inorganic layer 261 may be formed of an organic material having a refractive index of about 1.8 or more, and for example, may be formed of an organic material having a refractive index matching that of the organic light emitting layer 252.

The organic layer 262 may be transparently formed for transmitting the light L emitted from the organic light emitting layer 253. The organic layer 262 may be formed of an organic material capable of transmitting 99% or more of the light L emitted from the organic light emitting layer 253.

Moreover, the organic layer 262 may be formed to fill a space between adjacent banks 255, for planarizing a step height between the embossed patterns 241 caused by heights of the embossed pattern 241 of the planarization layer 240 and the bank 255. The organic layer 262 may be formed of an organic material having a refractive index of about 1.8 or more, and for example, may be formed of an organic material having a refractive index matching that of the organic light emitting layer 252. To this end, the organic layer 262 may include a vinyl compound, a photopolymerization initiator, toluene, and 2,6-di-tert-butyl-4-methylphenol. In this case, the vinyl compound may be phenyl sulfide.

A plurality of color filters RC and the black matrix BM may be formed on the second substrate 112 facing the first substrate 111. A red color filter RC may be formed in the red subpixel RP, a green color filter may be formed in the green subpixel GP, and a blue color filter may be formed in the blue subpixel BP. The black matrix BM may be disposed between color filters having different colors. Therefore, the black matrix BM may divide the subpixels RP, GP, and BP.

If the organic light emitting layer 252 includes the red light emitting layer that emits red light, the green light emitting layer that emits green light, and the blue light emitting layer that emits blue light, the color filters RC and the black matrix BM may be omitted.

The encapsulation layer 260 of the first substrate 111 and the color filters RC of the second substrate 112 may be adhered to each other by using an adhesive layer 270, and thus, the first substrate 111 and the second substrate 112 may be bonded to each other. The adhesive layer 270 may be a transparent adhesive resin.

As described above, in an embodiment of the present invention, the organic light emitting layer 252 and the first inorganic layer 261 and the organic layer 262 of the encapsulation layer 260 may be formed to have a refractive index of 1.8 or more, and the bank 255 may be formed to have a refractive index of 1.6 or less. Particularly, as a difference between a refractive index of the bank 255 and a refractive index of each of the organic light emitting layer 252, the first inorganic layer 261, and the organic layer 262 increases, a total reflection rate where the light L emitted from the organic light emitting layer 252 is totally reflected by the bank 255 becomes higher. Also, in order to increase a total reflection rate, the organic light emitting layer 252, the first inorganic layer 261, and the organic layer 262 may have the same refractive index.

As a result, in an embodiment of the present invention, a difference between a refractive index of the organic light emitting layer 252 and a refractive index of the first inorganic layer 261 may be less than a difference between a refractive index of the organic light emitting layer 252 and a refractive index of the bank 255 and a difference between a refractive index of the first inorganic layer 261 and a refractive index of the bank 255. Also, a difference between a refractive index of the organic light emitting layer 252 and a refractive index of the organic layer 262 may be less than a difference between a refractive index of the organic light emitting layer 252 and a refractive index of the bank 255 and a difference between a refractive index of the organic layer 262 and a refractive index of the bank 255. In this case, light which travels from the organic light emitting layer 252 to the bank 255 may travel from a medium having a high refractive index to a medium having a low refractive index, and thus, when the light is incident on the bank 255 at an angle which is equal to or greater than a predetermined threshold angle, the light may be totally reflected from a boundary of the bank 255. Accordingly, in an embodiment of the present invention, the light which travels from the organic light emitting layer 252 to the bank 255 may be totally reflected by the bank 255 and may be output in a direction toward an upper substrate, thereby reducing a loss of the light L emitted from the organic light emitting layer 252.

Moreover, in an embodiment of the present invention, a height of the bank 255 may be adjusted to 3 μm or more for increasing a total reflection effect by the bank 255 and the embossed pattern 241, and a height of the embossed pattern 241 may be adjusted lower than or equal to a height of the bank 255. In this case, a step height can occur due to the heights of the bank 255 and the embossed pattern 241. In an embodiment of the present invention, the encapsulation layer 260 may fill a space between adjacent banks 255 and a space between adjacent embossed patterns 241, and thus, the step height may be planarized. Particularly, according to an embodiment of the present invention, an organic material filling the space between the adjacent banks 255 and the space between the adjacent embossed patterns 241 may have a refractive index matching a refractive index of the organic light emitting layer 252, and thus, the light which travels from the organic light emitting layer 252 to the bank 255 may be totally reflected by the bank 255 and may be output in the direction toward the upper substrate (i.e., the second substrate 112).

Furthermore, in an embodiment of the present invention, the planarization layer 240 may include the embossed pattern 241, and the first electrode 251 may be formed on the embossed pattern 241. In an embodiment of the present invention, since the first electrode 251 is formed of a metal material having a high reflectivity, light which travels from the organic light emitting layer 252 to the embossed pattern 241 may be totally reflected by the first electrode 251 and may be output in the direction toward the upper substrate, thereby reducing a loss of the light L emitted from the organic light emitting layer 252. Also, since the first electrode 251 is formed of a metal material having a high reflectivity, a total reflection effect which is higher than total reflection caused by a refractive index difference of the bank 255 can be obtained.

Figure 8:
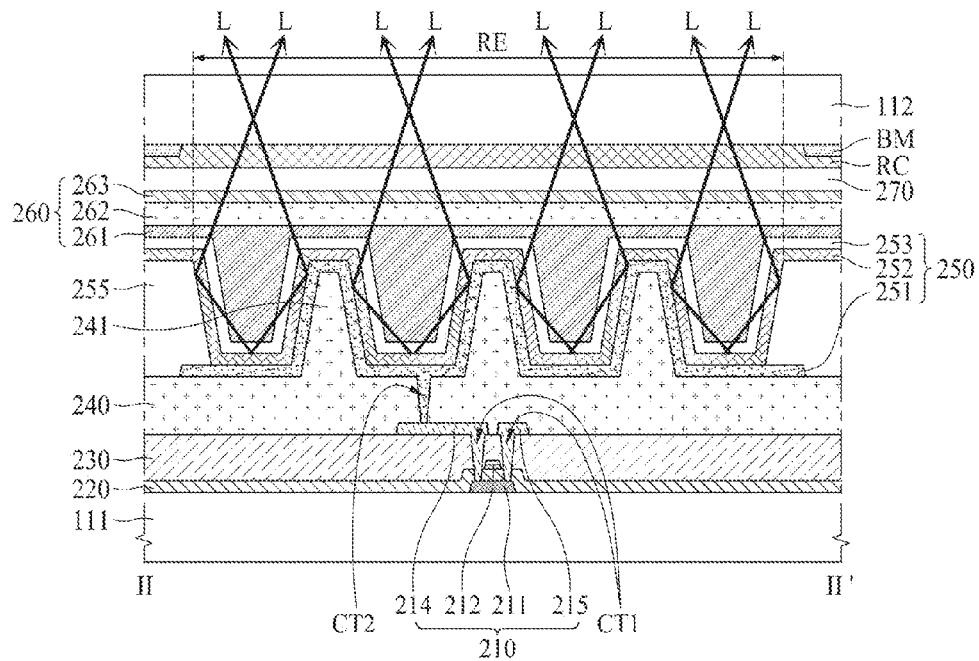
FIG. 8 is a cross-sectional view illustrating another example taken along line II-II' of FIG. 6.

FIG. 8 is a cross-sectional view illustrating another example taken along line II-II' of FIG. 6.

Except that a first inorganic layer 261 instead of an organic layer 262 fills a space between adjacent banks 255 for planarizing a step height between the bank 255 and an emission part RE, the cross-sectional view of FIG. 8 is as substantially described above with reference to FIG. 7. Therefore, a detailed description on the cross-sectional view of FIG. 8 is omitted.

Figure 9:
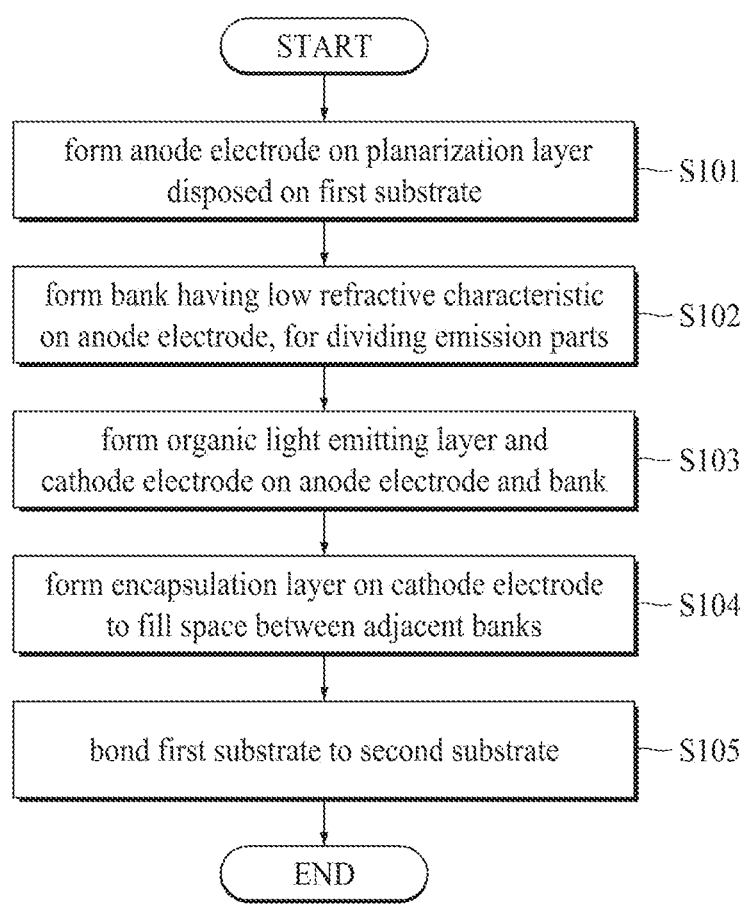
FIG. 9 is a flowchart illustrating a method of manufacturing an organic light emitting display device, according to an embodiment of the present invention.

FIG. 9 is a flowchart illustrating a method of manufacturing an organic light emitting display device, according to an embodiment of the present invention. FIGS. 10A to 10E are cross-sectional views taken along line I-I' of FIG. 3 for describing a method of manufacturing an organic light emitting display device, according to an embodiment of the present invention. The cross-sectional views illustrated in FIGS. 10A to 10E relate to a method of manufacturing an organic light emitting display device illustrated in FIG. 4, and like reference numerals refer to like elements. Hereinafter, a method of manufacturing an organic light emitting display device according to an embodiment of the present invention will be described in detail with reference to FIGS. 9 and 10A to 10E.

Figure 10A:
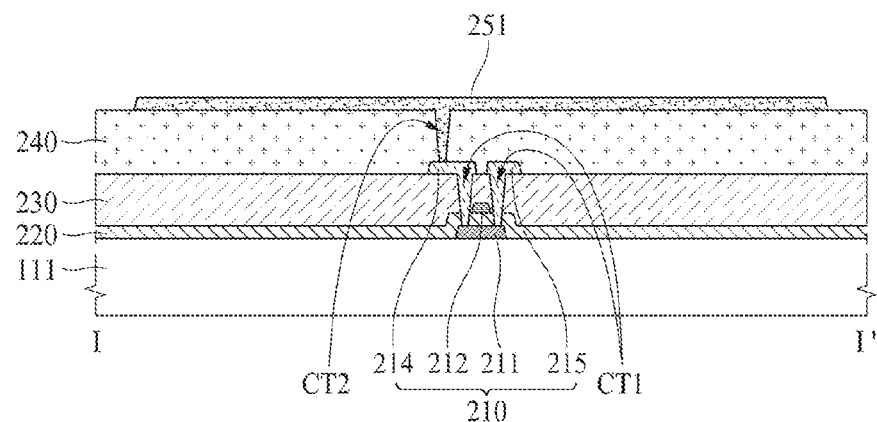
FIGS. 10A to 10E are cross-sectional views taken along line I-I' of FIG. 3 for describing a method of manufacturing an organic light emitting display device, according to an embodiment of the present invention.

First, as in FIG. 10A, a plurality of TFTs 210 may be formed on a first substrate 111, a planarization layer 240 for planarizing a top of each of the TFTs 210 may be formed, and the first electrode 251 may be formed on the planarization layer 240.

In detail, an active layer 211 may be formed on the first substrate 111, a gate insulation layer 220 may be formed on the active layer 211, a plurality of gate electrodes 212 and a plurality of gate lines may be formed on the gate insulation layer 220, an interlayer insulation layer 230 may be formed on the gate electrodes 212, and a plurality of source electrodes 215, a plurality of drain electrodes 214, and a plurality of data lines may be formed on the interlayer insulation layer 230. Each of the source electrodes 215 and the drain electrodes 214 may contact the active layer 211 through a contact hole CT1 which passes through the gate insulation layer 220 and the interlayer insulation layer 230.

Subsequently, the planarization layer 240 for planarizing the top of each of the TFTs 210 may be formed on the source electrodes 215, the drain electrodes 214, and the data lines.

Subsequently, the first electrode 251 may be formed on the planarization layer 240. The first electrode 251 may be connected to the drain electrode 214 through a contact hole CT2 which passes through the planarization layer 240. (S101 of FIG. 9)

Figure 10B:
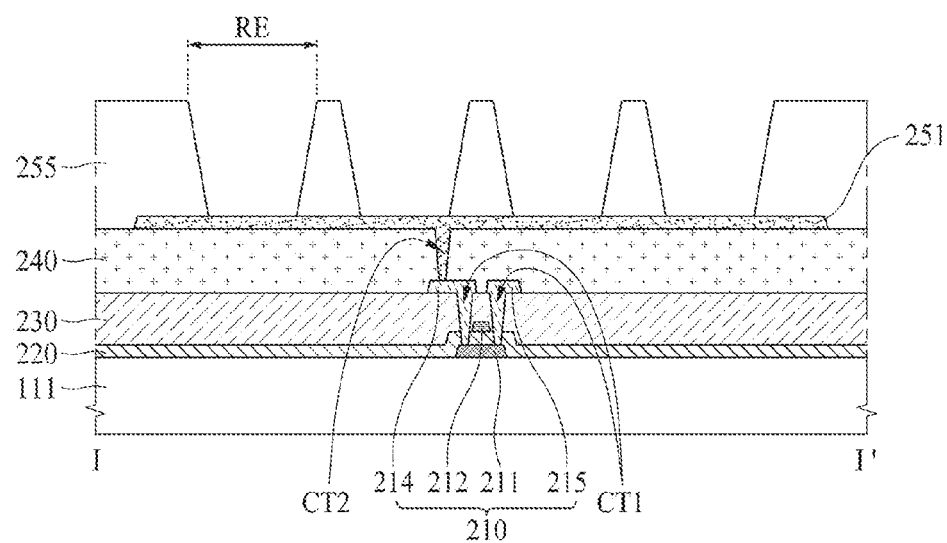

Second, as in FIG. 10B, the bank 255 may be formed on the first electrode 251 for dividing a plurality of emission parts.

The bank 255 may be formed of an organic material having a refractive index lower than that of the organic light emitting layer 252, for totally reflecting light emitted from the organic light emitting layer 252. For example, the bank 255 may be formed of an organic material having a refractive index of 1.6 or less, and for example, may be formed of a photo acryl-based material. Also, a height of the bank 255 may be adjusted to 3 µm or more, for increasing a ratio where the light emitted from the organic light emitting layer 252 is totally reflected by the bank 255.

An organic material may be coated on the first electrode 251 in a spin coating process or a slit coating process, and then, the bank 255 may be formed by exposing the organic material through a photo process. In a case of coating the organic material in the spin coating process, a viscosity of the organic material may be about 30 cp to 100 cp. In a case of coating the organic material in the slit coating process, a viscosity of the organic material may be about 10 cp or less. (S102 of FIG. 9)

Figure 10C:
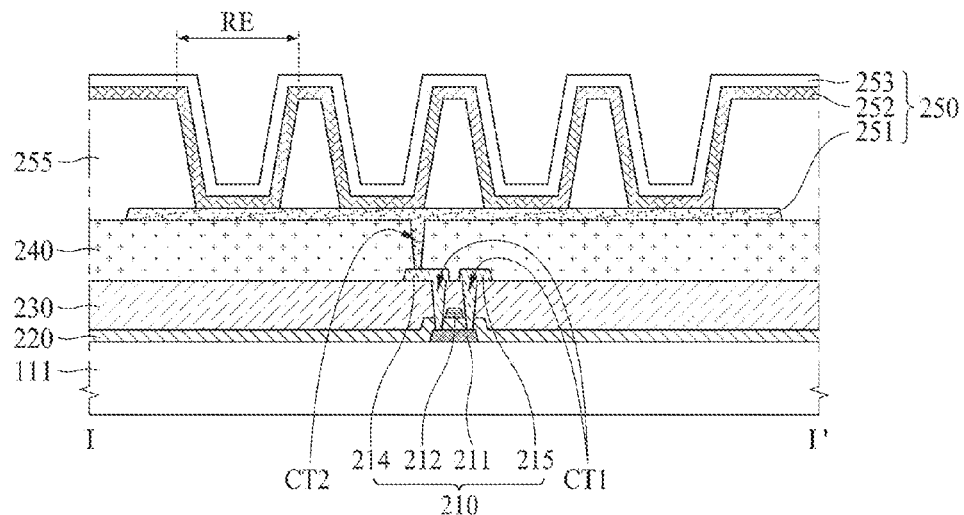

Third, as illustrated in FIG. 10C, the organic light emitting layer 252 and the second electrode 253 may be formed on the first electrode 251 and the bank 255.

The organic light emitting layer 252 may be formed in a deposition process or a solution process. In a case where the organic light emitting layer 252 is formed in the deposition process, the organic light emitting layer 252 may be formed by using an evaporation process. The organic light emitting layer 252 may be formed of an organic material having a refractive index of about 1.8 or more.

The second electrode 253 may be formed through a deposition process such as sputtering. The second electrode 253 may be formed of a transparent conductive material (or TCO), such as indium tin oxide (ITO) or indium zinc oxide (IZO) capable of transmitting light, or may be formed of a semi-transmissive conductive material such as Mg, Ag, or an alloy of Mg and Ag. (S103 of FIG. 9)

Figure 10D:
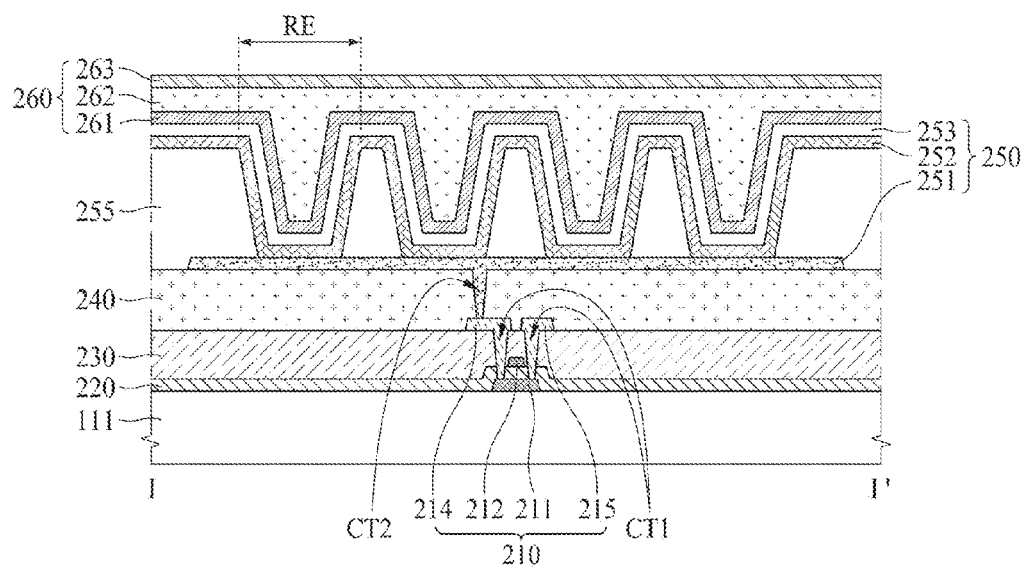

Fourth, as in FIG. 10D, an encapsulation layer 260 may be formed on the second electrode 253. The encapsulation layer 260 may fill a space between adjacent banks 255 to planarize a top of the second electrode 253.

In FIG. 10D, the encapsulation layer 260 is illustrated as including a first inorganic layer 261, an organic layer 262, and a second inorganic layer 263, but is not limited thereto.

The first inorganic layer 261 may be formed to cover the second electrode 253, the organic layer 262 may be formed on the first inorganic layer 261, and the second inorganic layer 263 may be formed to cover the organic layer 262.

Each of the first and second inorganic layers 261 and 263 may be formed of silicon nitride, aluminum nitride, zirconium nitride, titanium nitride, hafnium nitride, tantalum nitride, silicon oxide, aluminum oxide, titanium oxide, and/or the like. The first inorganic layer 261 may be formed of an organic material having a refractive index of about 1.8 or more, and for example, may be formed of an organic material having a refractive index matching that of the organic light emitting layer 252.

The organic layer 262 may be transparently formed for transmitting the light emitted from the organic light emitting layer 253. The organic layer 262 may be formed of an organic material capable of transmitting 99% or more of the light emitted from the organic light emitting layer 253.

Moreover, the organic layer 262 may be formed to fill a space between adjacent banks 255 so as to planarize a step height, caused by a height of the bank 255, between the bank 255 and an emission part RE. The organic layer 262 may be formed of an organic material having a refractive index of about 1.8 or more, and for example, may be formed of an organic material having a refractive index matching that of the organic light emitting layer 252. To this end, the organic layer 262 may include a vinyl compound, a photopolymerization initiator, toluene, and 2,6-di-tert-butyl-4-methylphenol. In this case, the vinyl compound may be phenyl sulfide.

In this case, an organic material may be coated on the first inorganic layer 261 in a screen printing process or an inkjet printing process, and then, the organic layer 262 may be formed by UV-curing or thermally curing the organic material. In a case of coating the organic material in the screen printing process, a viscosity of the organic material may be about 3,000 cp or more. In a case of coating the organic material in the inkjet printing process, a viscosity of the organic material may be about 20 cp or less.

As in FIG. 5, a space between adjacent banks 255 may be filled with the first inorganic layer 261 instead of the organic layer 262, for planarizing a step height between the bank 255 and the emission part RE. (S104 of FIG. 9)

Figure 10E:
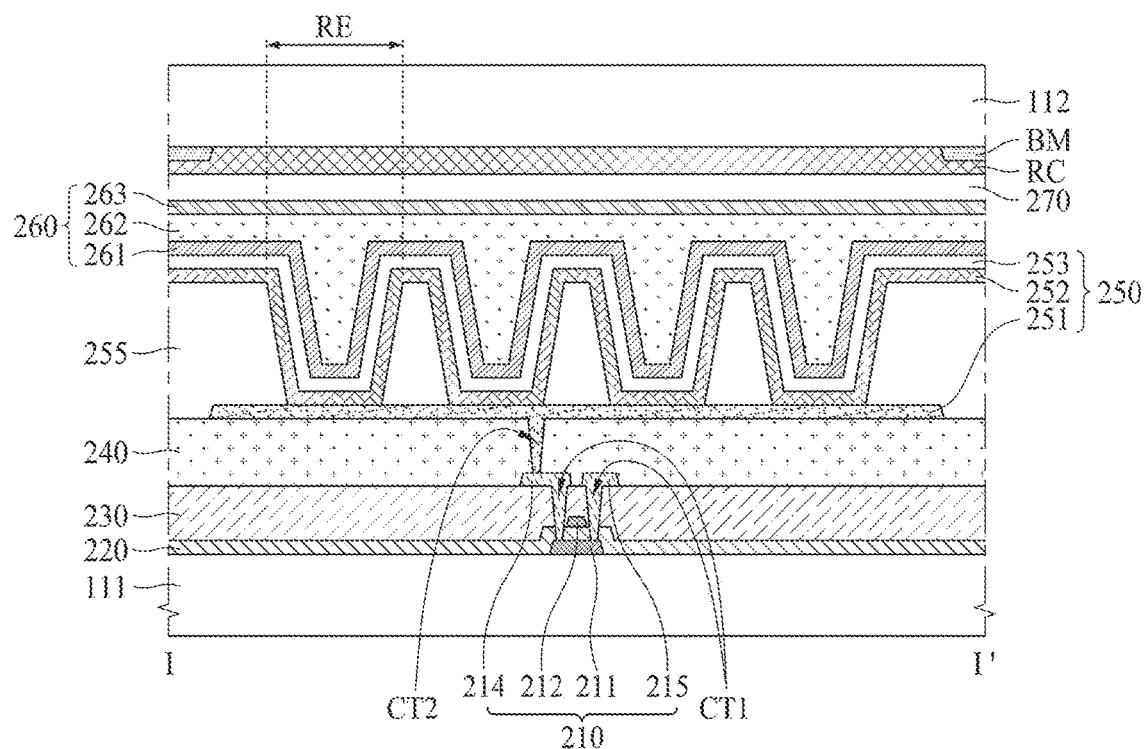

Fifth, as in FIG. 10E, the encapsulation layer 260 of the first substrate 111 and color filters RC of the second substrate 112 may be adhered to each other by using an adhesive layer 270, thereby bonding the first substrate 111 to the second substrate 112. The adhesive layer 270 may be a transparent adhesive resin. (S105 of FIG. 9)

Figure 11:
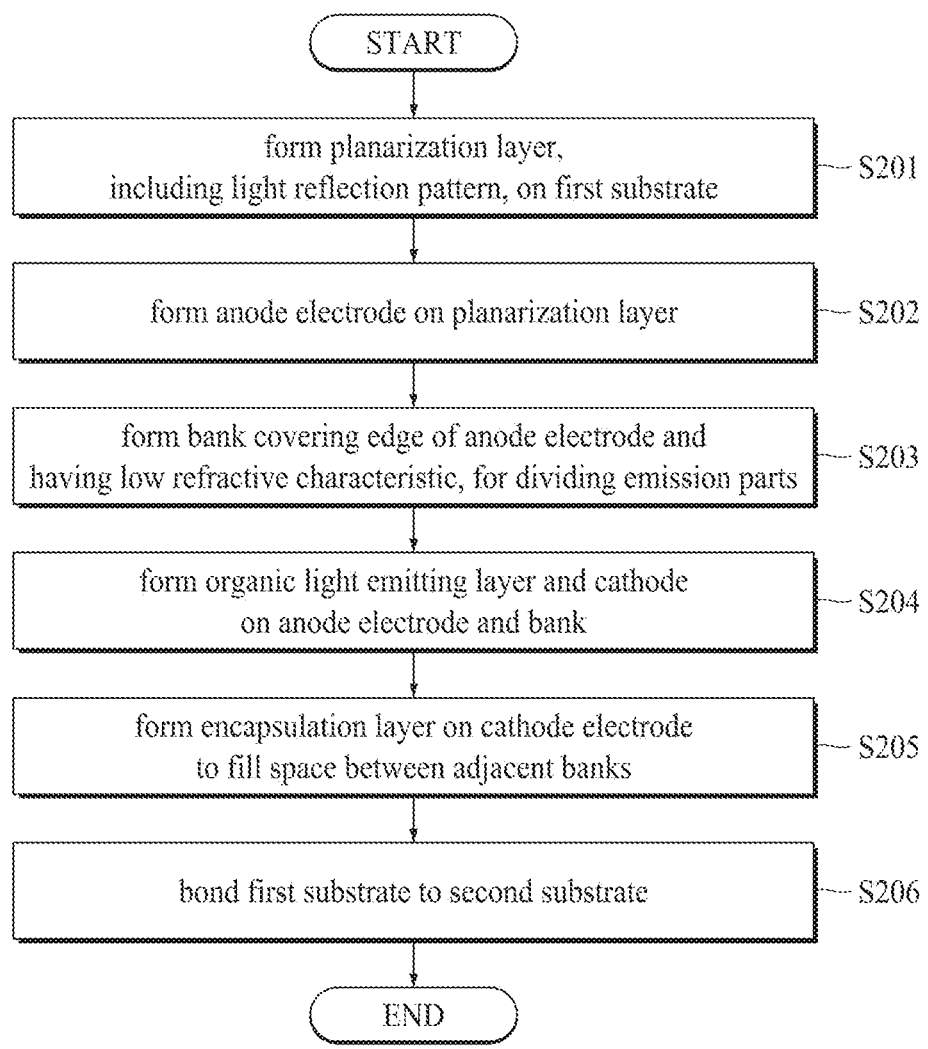
FIG. 11 is a flowchart illustrating a method of manufacturing an organic light emitting display device, according to another embodiment of the present invention.

FIG. 11 is a flowchart illustrating a method of manufacturing an organic light emitting display device, according to another embodiment of the present invention. FIGS. 12A to 12F are cross-sectional views taken along line II-II' of FIG. 6 for describing a method of manufacturing an organic light emitting display device, according to an embodiment of the present invention. The cross-sectional views illustrated in FIGS. 12A to 12F relate to a method of manufacturing an organic light emitting display device illustrated in FIG. 7, and like reference numerals refer to like elements. Hereinafter, a method of manufacturing an organic light emitting display device according to an embodiment of the present invention will be described in detail with reference to FIGS. 11 and 12A to 12F.

Figure 12A:
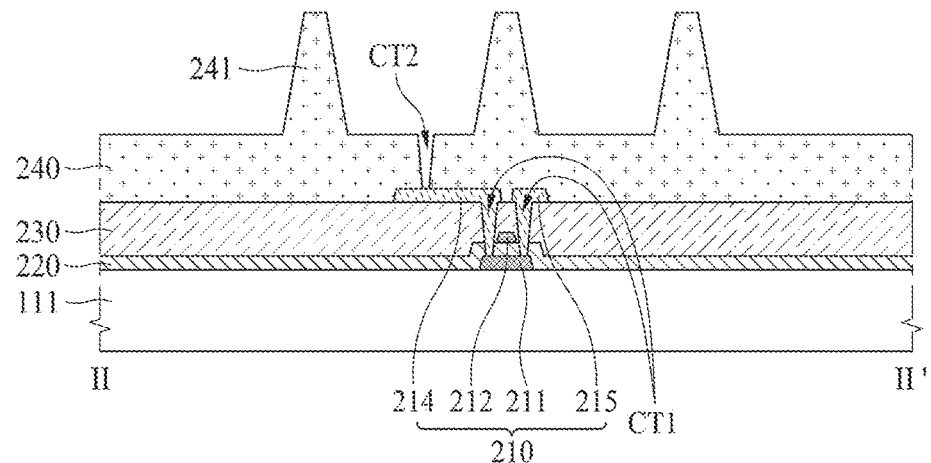
FIGS. 12A to 12F are cross-sectional views taken along line II-II' of FIG. 6 for describing a method of manufacturing an organic light emitting display device, according to an embodiment of the present invention.

First, as in FIG. 12A, a plurality of TFTs 210 may be formed on a first substrate 111, and a planarization layer 240 for planarizing a top of each of the TFTs 210 may be formed.

A method of forming the TFTs 210 on the first substrate 111 is substantially the same as the method described above in operation S101 of FIG. 9, and thus, its detailed description is omitted.

After the TFTs 210 are formed, the planarization layer 240 for planarizing the top of each of the TFTs 210 may be formed on a plurality of source electrodes 215, a plurality of drain electrodes 214, and a plurality of data lines. The planarization layer 240 may include an embossed pattern 241 that protrudes from the planarization layer 240. The embossed pattern 241 may be disposed between adjacent banks 255. Also, a height of the embossed pattern 241 may be equal to or lower than that of the bank 255. (S201 of FIG. 11)

Figure 12B:
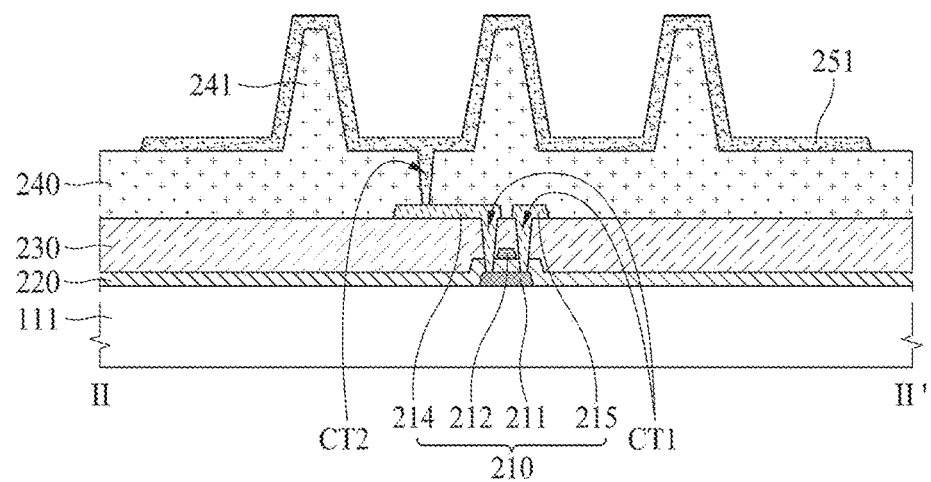

Second, as in FIG. 12B, a first electrode 251 may be formed on the planarization layer 240. The first electrode 251 may be connected to the drain electrode 214 through a contact hole CT2 which passes through the planarization layer 240.

The first electrode 251 may also be formed on the embossed pattern 241 of the planarization layer 240. Therefore, the first electrode 251 may totally reflect light traveling from the organic light emitting layer 252 to the embossed pattern 241, and the light may be output in a direction toward an upper substrate. Accordingly, according to an embodiment of the present invention, a loss of light emitted from the organic light emitting layer 252 is reduced. (S202 of FIG. 11)

Figure 12C:
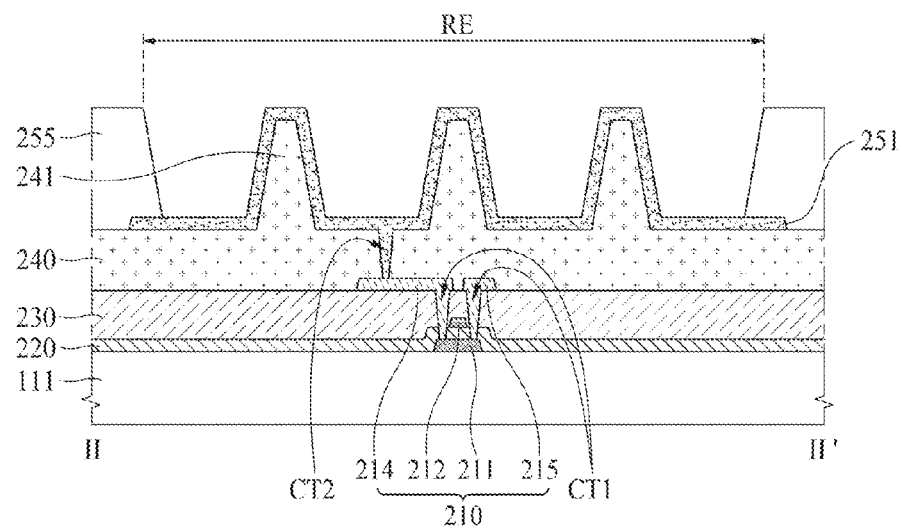

Third, as in FIG. 12C, the bank 255 covering an edge of the first electrode 251 may be formed for dividing a plurality of emission parts.

The bank 255 may be formed of an organic material having a refractive index lower than that of the organic light emitting layer 252, for totally reflecting the light emitted from the organic light emitting layer 252. For example, the bank 255 may be formed of an organic material having a refractive index of 1.6 or less. Also, a height of the bank 255 may be adjusted to 3 μm or more, for increasing a ratio where the light emitted from the organic light emitting layer 252 is totally reflected by the bank 255.

An organic material may be coated on the first electrode 251 in a spin coating process or a slit coating process, and then, the bank 255 may be formed by exposing the organic material through a photo process. In a case of coating the organic material in the spin coating process, a viscosity of the organic material may be about 30 cp to 100 cp. In a case of coating the organic material in the slit coating process, a viscosity of the organic material may be about 10 cp or less. (S203 of FIG. 11)

Figure 12D:
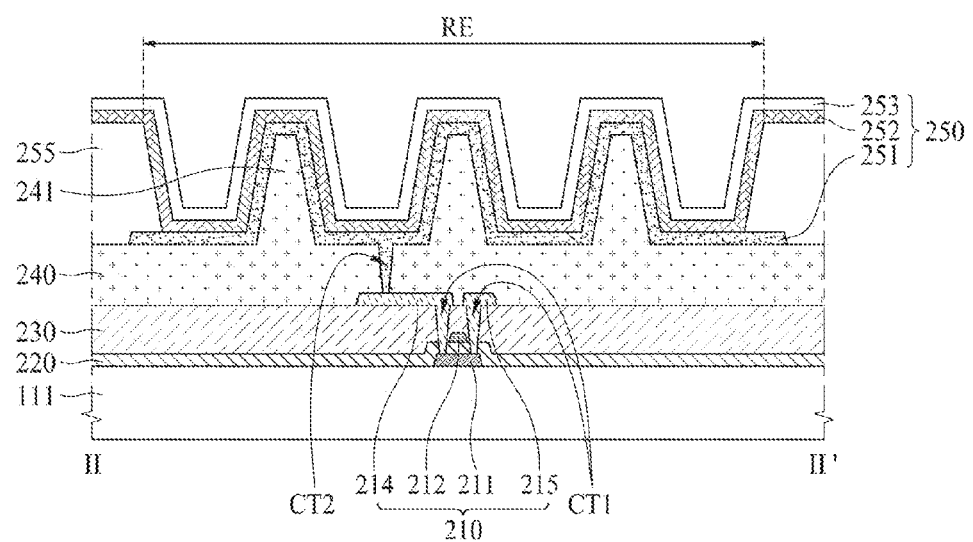

Fourth, as in FIG. 12D, the organic light emitting layer 252 and the second electrode 253 may be formed on the first electrode 251 and the bank 255.

A method of forming the organic light emitting layer 252 and the second electrode 253 on the first electrode 251 and the bank 255 is substantially the same as the method described above in operation S103 of FIG. 9, and thus, its detailed description is omitted. (S204 of FIG. 11)

Figure 12E:
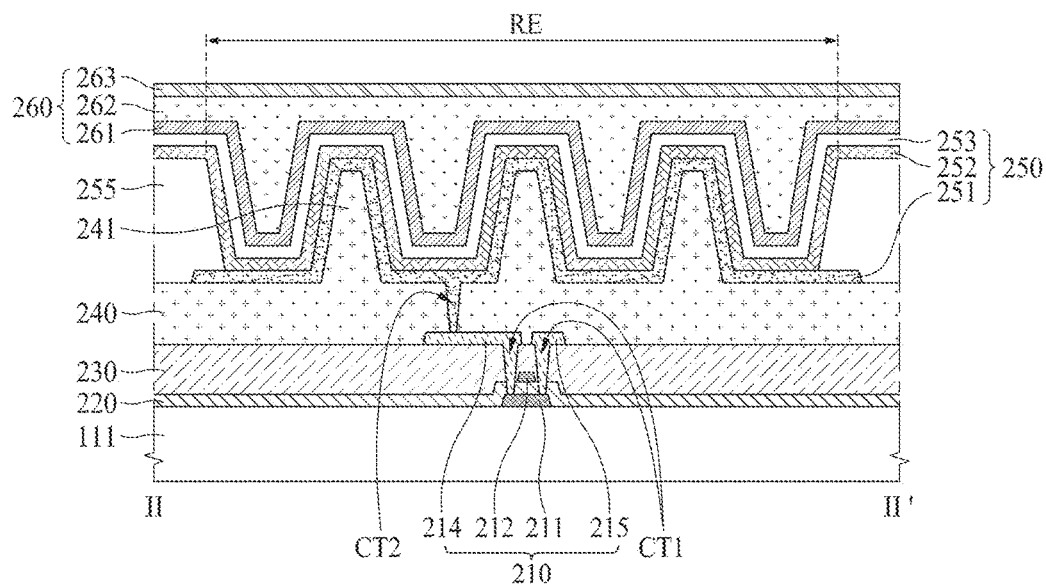

Fifth, as in FIG. 12E, an encapsulation layer 260 may be formed on the second electrode 253. The encapsulation layer 260 may fill a space between adjacent banks 255 to planarize a top of the second electrode 253.

A method of forming the encapsulation layer 260 on the second electrode 253 is substantially the same as the method described above in operation S104 of FIG. 9, and thus, its detailed description is omitted. (S205 of FIG. 11)

Figure 12F:
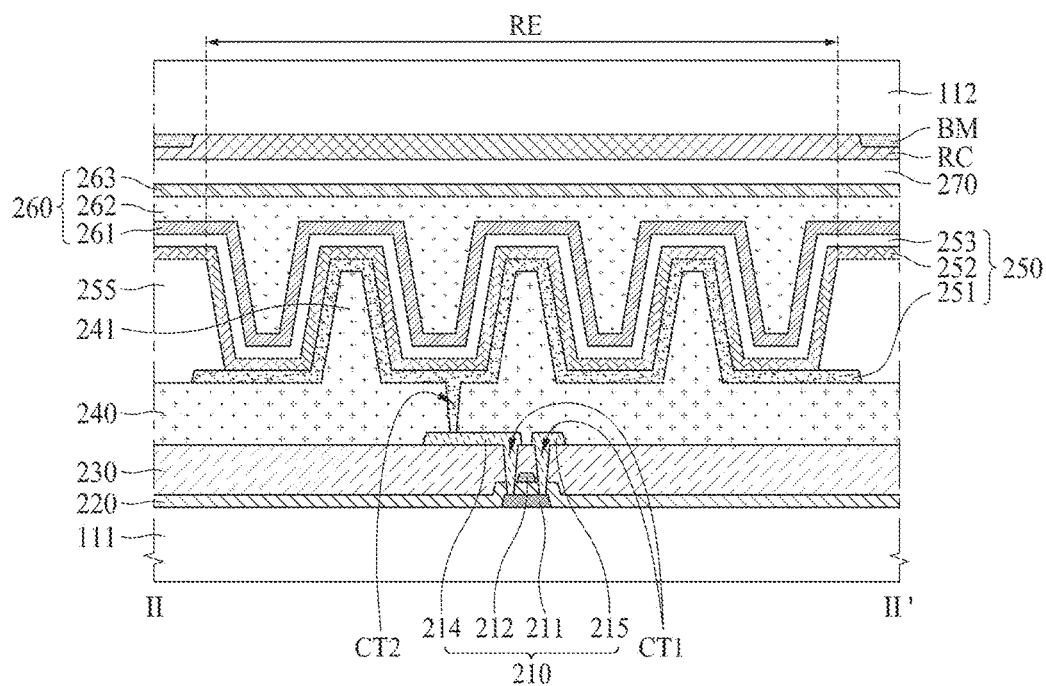

Sixth, as in FIG. 12F, the encapsulation layer 260 of the first substrate 111 and color filters RC of the second substrate 112 may be adhered to each other by using an adhesive layer 270, thereby bonding the first substrate 111 to the second substrate 112. The adhesive layer 270 may be a transparent adhesive resin. (S206 of FIG. 11)

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a first electrode on a first substrate and electrically connected to a thin film transistor;
a bank on the first electrode, the bank dividing a plurality of emission parts;
a planarization layer under the first electrode, the planarization layer including a plurality of embossed patterns disposed between adjacent parts of the bank and protruding from the planarization layer, a gate electrode of the thin film transistor positioned under one of the embossed patterns to overlap with said one of the embossed patterns and the plurality of emission parts formed between the emission parts;
an organic light emitting layer on the first electrode and the bank;
a second electrode on the organic light emitting layer; and
an encapsulation layer on the second electrode,
wherein
the encapsulation layer fills a space between the adjacent parts of the bank,
the organic light emitting layer corresponding to the plurality of emission parts is electrically connected to the same first electrode, and the plurality of emission parts emit same color of light,
a refractive index of the bank is lower than a refractive index of the organic light emitting layer and a refractive index of the encapsulation layer, and
a difference between the refractive index of the organic light emitting layer and the refractive index of the encapsulation layer is less than a difference between the refractive index of the bank and the refractive index of the organic light emitting layer.

2. The organic light emitting display device of claim 1, wherein the difference between the refractive index of the organic light emitting layer and the refractive index of the encapsulation layer is less than a difference between the refractive index of the bank and the refractive index of the encapsulation layer.

3. The organic light emitting display device of claim 1, wherein a height of the embossed patterns is lower than or equal to a height of the bank.

4. The organic light emitting display device of claim 1, wherein a material of the embossed patterns differs from a material of the bank.

5. The organic light emitting display device of claim 1, wherein the encapsulation layer fills a space between adjacent embossed patterns.

6. An organic light emitting display device comprising:
a first electrode on a first substrate and electrically connected to a thin film transistor;
a bank on the first electrode, the bank dividing a plurality of emission parts included in a subpixel;
a planarization layer under the first electrode, the planarization layer including a plurality of embossed patterns disposed between adjacent parts of the bank and protruding from the planarization layer, a gate electrode of the thin film transistor positioned under one of the embossed patterns to overlap with said one of the embossed patterns and the plurality of emission parts formed between the emission parts;

an organic light emitting layer on the first electrode and the bank;

a second electrode on the organic light emitting layer; and an encapsulation layer on the second electrode, wherein the encapsulation layer fills a space between the adjacent parts of the bank, the organic light emitting layer corresponding to the plurality of emission parts is electrically connected to the same first electrode, and the plurality of emission parts emit same color of light, and a refractive index of the bank is lower than a refractive index of the organic light emitting layer and a refractive index of the encapsulation layer.

7. The organic light emitting display device of claim 6, wherein a difference between the refractive index of the organic light emitting layer and the refractive index of the encapsulation layer is less than a difference between the refractive index of the bank and the refractive index of the encapsulation layer.

8. The organic light emitting display device of claim 6, wherein a difference between the refractive index of the organic light emitting layer and the refractive index of the encapsulation layer is less than a difference between the refractive index of the bank and the refractive index of the organic light emitting layer.

9. An organic light emitting diode (OLED) display device including a plurality of pixels, at least one of the pixels comprising:

a first substrate;

a driving transistor of said at least one of the pixels on the first substrate;

one or more banks on the first substrate;

an organic light emitting diode (OLED) including a first electrode, an organic light emission layer on the first electrode, and a second electrode on the organic light emission layer and shaped as one or more emission parts between the banks, at least one of the emission parts including a plurality of convex regions protruding away from the first substrate and a plurality of concave regions protruding toward the first substrate, the convex regions alternating with the concave regions and each of the convex regions disposed on a corresponding convex pattern of a material having a first refractive index lower than a second refractive index of the organic light emission layer; and an encapsulation layer on the OLED.

10. The OLED display device of claim 9, wherein the organic light emission layer of two or more of the emission parts is electrically connected to the same first electrode, and the two or more of the emission parts emit same color of light.

11. The OLED display device of claim 9, wherein the first refractive index of the material of the convex pattern is lower than a third refractive index of the encapsulation layer.

12. The OLED display device of claim 9, wherein a first difference between the second refractive index of the organic light emitting layer and a third refractive index of the encapsulation layer is less than a second difference between a fourth refractive index of the banks and the second refractive index of the organic light emitting layer.

13. The OLED display device of claim 9, wherein a first difference between the second refractive index of the organic light emitting layer and a third refractive index of the encapsulation layer is less than a second difference between a fourth refractive index of the banks and the third refractive index of the encapsulation layer.

14. The OLED display device of claim 9, wherein the convex pattern is part of the banks.

15. The OLED display device of claim 9, wherein the convex pattern is part of a planarization layer covering the driving transistor and the first substrate.

16. The OLED display device of claim 9, wherein the first electrode is disposed on the convex pattern.

17. The OLED display device of claim 9, wherein a first height of the convex pattern is lower than a second height of the banks.

18. The OLED display device of claim 9, wherein the encapsulation layer comprises:

a first inorganic layer on the second electrode;

an organic layer on the first inorganic layer, the organic layer filling space between adjacent ones of the banks; and a second inorganic layer on the organic layer.

19. The OLED display device of claim 9, wherein the encapsulation layer comprises:

a first inorganic layer on the second electrode, the first inorganic layer filling space between adjacent ones of the banks;

an organic layer on the first inorganic layer; and a second inorganic layer on the organic layer.

20. An organic light emitting diode (OLED) display device including a plurality of pixels, at least one of the pixels comprising:

a first substrate;

a driving transistor of said at least one of the pixels on the first substrate;

one or more banks on the first substrate;

an organic light emitting diode (OLED) including a first electrode, an organic light emission layer on the first electrode, and a second electrode on the organic light emission layer and shaped as one or more emission parts between the banks, at least one of the emission parts including a plurality of convex regions protruding away from the first substrate and a plurality of concave regions protruding toward the first substrate, the convex regions alternating with the concave regions and each of the convex regions disposed on a corresponding convex pattern of a material having a first refractive index lower than a second refractive index of the organic light emission layer; and an encapsulation layer on the OLED, wherein the first electrode is disposed below the convex pattern.

* * * * *